(12) United States Patent
Frisina et al.

(10) Patent No.: US 9,142,646 B2
(45) Date of Patent: Sep. 22, 2015

(54) INTEGRATED ELECTRONIC DEVICE WITH EDGE-TERMINATION STRUCTURE AND MANUFACTURING METHOD THEREOF

(71) Applicant: STMICROELECTRONICS S.R.L., Agrate Brianza (IT)

(72) Inventors: Ferruccio Frisina, S. Agata Li Battiati (IT); Angelo Magri', Belpasso (IT); Mario Giuseppe Saggio, Aci Bonaccorsi (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/645,185

(22) Filed: Mar. 11, 2015

(65) Prior Publication Data

US 2015/0187912 A1 Jul. 2, 2015

Related U.S. Application Data

(62) Division of application No. 13/221,778, filed on Aug. 30, 2011, now Pat. No. 9,018,635.

(30) Foreign Application Priority Data

Aug. 30, 2010 (IT) .............................. TO2010A0724

(51) Int. Cl.
*H01L 21/20* (2006.01)
*H01L 29/66* (2006.01)
(Continued)

(52) U.S. Cl.
CPC .... *H01L 29/66666* (2013.01); *H01L 21/02529* (2013.01); *H01L 21/02532* (2013.01);
(Continued)

(58) Field of Classification Search
CPC .................. H01L 29/66068; H01L 29/7813; H01L 29/7811
See application file for complete search history.

(56) References Cited

U.S. PATENT DOCUMENTS 4,074,293 A  2/1978  Kravitz
5,272,096 A  12/1993  De Fresart et al.
(Continued)

FOREIGN PATENT DOCUMENTS

EP  0726604  8/1996
EP  1263052  12/2002
(Continued)

OTHER PUBLICATIONS

Bakowski et al., "Development of 3C-SiC MOSFETs", Journal of Telecommunications and Information Technology, Feb. 2007, pp. 49-56.
(Continued)

*Primary Examiner* — Jaehwan Oh
(74) *Attorney, Agent, or Firm* — Allen, Dyer, Dopperlt, Milbrath & Gilchrist, P.A.

(57) ABSTRACT

An embodiment of an integrated electronic device formed in a semiconductor body delimited by a lateral surface, which includes: a substrate made of a first semiconductor material; a first epitaxial region made of a second semiconductor material, which overlies the substrate and defines a first surface; a second epitaxial region made of a third semiconductor material, which overlies the first surface and is in contact with the first epitaxial region, the third semiconductor material having a bandgap narrower than the bandgap of the second semiconductor material; an active area, extending within the second epitaxial region and housing at least one elementary electronic component; and an edge structure, arranged between the active area and the lateral surface, and including a dielectric region arranged laterally with respect to the second epitaxial region, which overlies the first surface and is in contact with the first epitaxial region.

30 Claims, 13 Drawing Sheets

(51) Int. Cl.
*H01L 29/16* (2006.01)
*H01L 29/165* (2006.01)
*H01L 29/06* (2006.01)
*H01L 21/02* (2006.01)

(52) U.S. Cl.
CPC .......... *H01L29/0619* (2013.01); *H01L 29/165* (2013.01); *H01L 29/1608* (2013.01); *H01L 29/66431* (2013.01)

(56) References Cited

U.S. PATENT DOCUMENTS

| | | | |
|---|---|---|---|
| 5,459,089 A * | 10/1995 | Baliga | 438/167 |
| 5,661,312 A | 8/1997 | Weitzel et al. | |
| 5,877,515 A | 3/1999 | Ajit | |
| 5,903,020 A | 5/1999 | Siergiej et al. | |
| 6,002,143 A * | 12/1999 | Terasawa | 257/77 |
| 6,239,463 B1 | 5/2001 | Williams et al. | |
| 6,331,727 B1 * | 12/2001 | Nakajima et al. | 257/587 |
| 6,458,013 B1 | 10/2002 | Saka et al. | |
| 7,078,781 B2 * | 7/2006 | Hatakeyama et al. | 257/472 |
| 7,294,860 B2 * | 11/2007 | Mazzola et al. | 257/77 |
| 7,416,929 B2 * | 8/2008 | Mazzola et al. | 438/186 |
| 7,485,895 B2 | 2/2009 | Kaneko | |
| 7,489,011 B2 * | 2/2009 | Yilmaz | 257/409 |
| 7,646,061 B2 | 1/2010 | Hirler | |
| 7,671,383 B2 | 3/2010 | Hayashi et al. | |
| 7,691,711 B2 | 4/2010 | Stum et al. | |
| 7,719,055 B1 | 5/2010 | McNutt et al. | |
| 7,781,786 B2 | 8/2010 | Hayashi et al. | |
| 7,795,691 B2 | 9/2010 | Zhang et al. | |
| 7,851,274 B1 | 12/2010 | Shah | |
| 7,902,025 B2 | 3/2011 | Hayashi et al. | |
| 7,923,320 B2 | 4/2011 | Ryu | |
| 7,977,210 B2 | 7/2011 | Ota et al. | |
| 7,994,513 B2 | 8/2011 | Yamamoto et al. | |
| 7,999,343 B2 * | 8/2011 | Tihanyi et al. | 257/452 |
| 8,188,538 B2 | 5/2012 | Nakano et al. | |
| 8,278,682 B2 * | 10/2012 | Yoshikawa et al. | 257/139 |
| 8,350,317 B2 * | 1/2013 | Kocon | 257/328 |
| 2003/0222327 A1 * | 12/2003 | Yamaguchi et al. | 257/500 |
| 2004/0212011 A1 * | 10/2004 | Ryu | 257/335 |
| 2004/0222458 A1 * | 11/2004 | Hsieh et al. | 257/329 |
| 2005/0269573 A1 | 12/2005 | Seng et al. | |
| 2006/0006394 A1 * | 1/2006 | Kordina | 257/77 |
| 2006/0043379 A1 * | 3/2006 | Zhang et al. | 257/77 |
| 2006/0113593 A1 | 6/2006 | Sankin et al. | |
| 2007/0050530 A1 * | 3/2007 | Rajan | 711/5 |
| 2007/0096172 A1 * | 5/2007 | Tihanyi et al. | 257/288 |
| 2007/0158658 A1 | 7/2007 | Ryu | |
| 2007/0235745 A1 | 10/2007 | Hayashi et al. | |
| 2008/0150020 A1 * | 6/2008 | Challa et al. | 257/331 |
| 2009/0008709 A1 * | 1/2009 | Yedinak et al. | 257/331 |
| 2009/0085064 A1 * | 4/2009 | Rueb et al. | 257/194 |
| 2009/0278169 A1 * | 11/2009 | Hayashi et al. | 257/183 |
| 2009/0280610 A1 * | 11/2009 | Umezaki | 438/270 |
| 2009/0315039 A1 * | 12/2009 | Tsuji | 257/77 |
| 2010/0001362 A1 * | 1/2010 | Van Dalen et al. | 257/490 |
| 2012/0037980 A1 * | 2/2012 | Peake et al. | 257/330 |

FOREIGN PATENT DOCUMENTS

| | | |
|---|---|---|
| EP | 1503425 | 2/2005 |
| EP | 1587147 | 10/2005 |
| JP | 6151867 | 5/1994 |

OTHER PUBLICATIONS

Grieb et al., "Electrical characterization of MOS structures with deposited oxides annealed in N20 or NO", materials Science Forum, vols. 615-617, 2009, pp. 521-524.

* cited by examiner

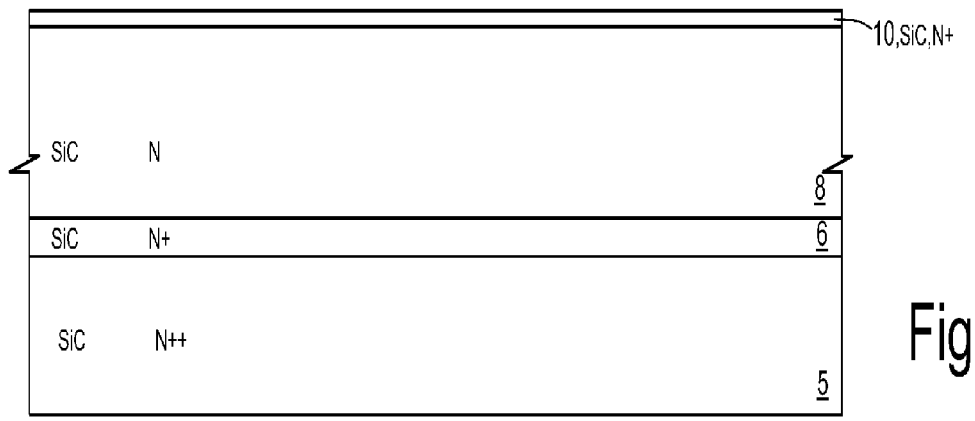
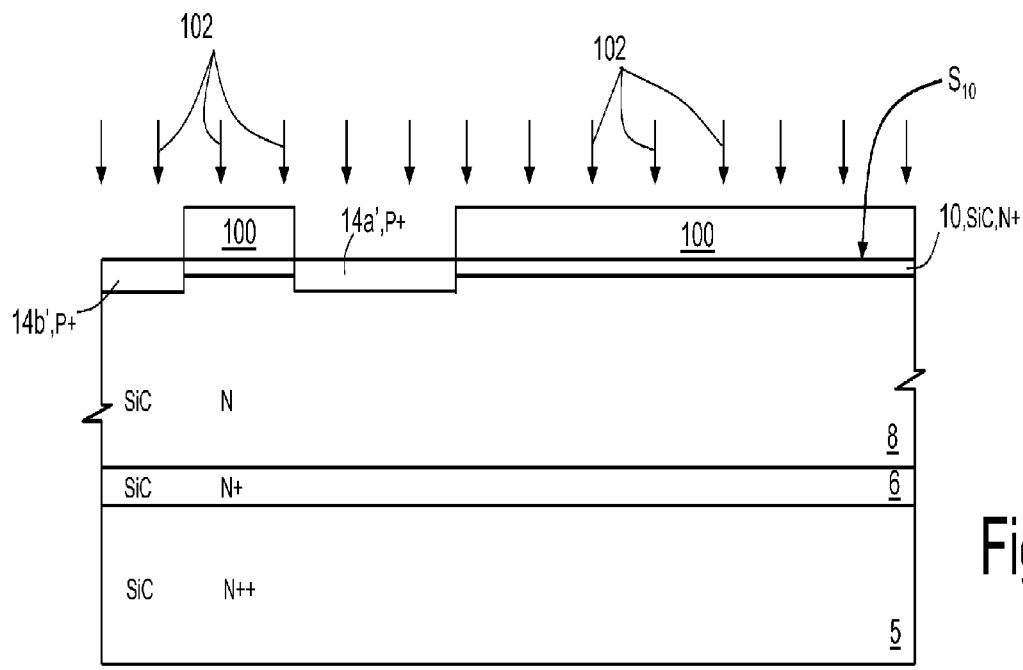

INTEGRATED ELECTRONIC DEVICE WITH EDGE-TERMINATION STRUCTURE AND MANUFACTURING METHOD THEREOF

RELATED APPLICATION DATA

This application is related to the U.S. patent application Ser. No. 13/221,694 entitled VERTICAL-CONDUCTION INTEGRATED ELECTRONIC DEVICE AND METHOD FOR MANUFACTURING THEREOF, filed Aug. 30, 2011, and application Ser. No. 13/221,733 entitled INTEGRATED ELECTRONIC DEVICE AND METHOD FOR MANUFACTURING THEREOF, filed Aug. 30, 2011, and which are incorporated herein by reference in their entireties.

TECHNICAL FIELD

An embodiment relates to an integrated electronic device having an edge-termination structure and to a manufacturing method thereof.

BACKGROUND

As is known, integrated electronic devices are formed within dies, which are manufactured starting from wafers of semiconductor material and have, in plan view, a generally rectangular or square shape.

In detail, the edges and corners of the dies correspond to the so-called "scribe lines", i.e., to the lines along which the wafers of semiconductor material are cut to form the dies themselves. In other words, the scribe lines define corresponding lateral surfaces of the dies.

In greater detail, each integrated electronic device can include a plurality of elementary electronic components, such as, for example, transistors, diodes, photodiodes, etc. Furthermore, given a generic die that houses at least one elementary electronic component, within the die it is possible to define a peripheral region (also known as "edge region"), adjacent to the scribe lines, and a central region, which is surrounded by the peripheral region and in which the at least one elementary electronic component is physically made. In addition, in the peripheral region there is usually provided a so-called edge-termination structure.

As is known, the edge-termination structures surround corresponding active areas, i.e., areas set within the central regions and housing the elementary electronic components. In use, the edge-termination structures perform the function of preventing onset of breakdown phenomena within the peripheral regions, which are more subject to the phenomenon of breakdown as compared to the central regions. In fact, the active areas, and hence the central regions, are typically designed so that the elementary electronic components housed therein can sustain (in theory) a maximum voltage $V_{max}$, before the breakdown of the PN junctions present within said elementary electronic components occurs. Instead, within the edge regions, it is possible for breakdown to occur also at voltages much lower than the maximum voltage $V_{max}$, with consequent limitation of the voltage that can effectively be applied to the elementary electronic components, and hence also to the integrated electronic device that houses them. In particular, the peripheral regions are more subject to the phenomenon of breakdown on account of the presence, in general, of corners and/or curvatures of doped regions, with consequent possibility, in use, of an increased density of the equipotential lines, i.e., an increase of the electrical field, to the point of causing breakdown of the semiconductor material that forms the peripheral regions.

For practical purposes, the edge-termination structures hence perform the function of reducing locally the intensity of the electrical field so as to prevent peaks of intensity of the electrical field in the proximity of the edges.

The presence of appropriate edge-termination structures is even more important in the case of integrated electronic devices formed at least in part not only of silicon but also of silicon carbide (SiC). In fact, within said integrated electronic devices very intense electrical fields are generated, which, in the central regions, are typically confined within portions made of silicon carbide, which has a critical electrical field higher than the critical electrical field of silicon. Instead, in the absence of appropriate edge-termination structures, it is possible, in the peripheral regions, for intense electrical fields to be generated also within silicon portions, with the consequent possibility of a breakdown occurring.

SUMMARY

An embodiment is an integrated electronic device and a manufacturing method that enable the drawbacks of the known art to be overcome at least in part.

BRIEF DESCRIPTION OF THE DRAWINGS

For a better understanding of the concepts disclosed herein, embodiments are now described, purely by way of non-limiting example and with reference to the annexed drawings, wherein:

FIGS. 6-20 show cross sections of embodiments of the present integrated electronic device during successive manufacturing steps.

DETAILED DESCRIPTION

Figure 1:
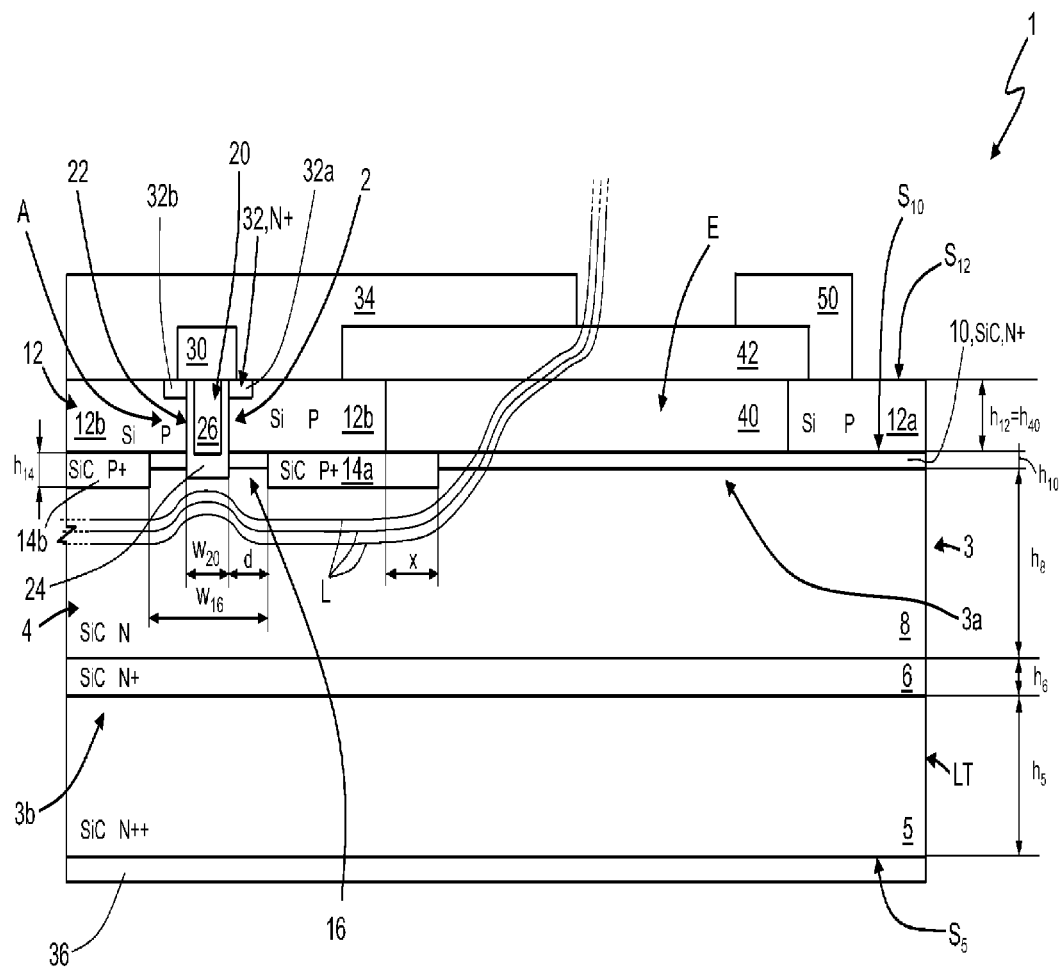
FIGS. 1-5 show cross sections of different embodiments of the present integrated electronic device.

FIG. 1 shows an embodiment of the present integrated electronic device 1, which is a vertical-conduction electronic device and forms a trench MOSFET 2.

In detail, the trench MOSFET 2 is formed in a die 3, in which it is possible to define a peripheral region 3a, adjacent to a scribe line LT, and a central region 3b, where the trench MOSFET 2 is physically made.

The die 3 includes a body 4 of semiconductor material, which includes, in turn, a substrate 5 of silicon carbide, of an N++ type (for example, doped with nitrogen), which has a bottom surface $S_5$; the silicon carbide can be of any polytype (4H, 6H, 3C, etc.). Furthermore, the body 4 includes a buffer layer 6, of an N+ type, as well as a bottom epitaxial layer 8 and an intermediate epitaxial layer 10 of an N and N+ type, respectively.

In detail, the buffer layer 6 is set on top of the substrate 5, with which it is in direct contact. The bottom epitaxial layer 8 is set on top of and in direct contact with the buffer layer 6. Moreover, the intermediate epitaxial layer 10 is set on top of and in direct contact with the bottom epitaxial layer 8.

The substrate 5 has a thickness $h_5$ that may be, for example, approximately between 100 μm and 600 μm, and moreover has a doping level that can be, for example, approximately between $1 \cdot 10^{18}$ cm$^{-3}$ and $1 \cdot 10^{19}$ cm$^{-3}$.

The buffer layer 6 has a thickness $h_6$ that can, for example, be approximately 0.5 μm, and moreover has a doping level that can, for example, be approximately $1 \cdot 10^{18}$ cm$^{-3}$.

The bottom epitaxial layer 8 has a thickness $h_8$ that can, for example, be approximately 9 μm, and moreover has a doping level that can, for example, be approximately $1 \cdot 10^{15}$ cm$^{-3}$.

As regards, instead, the intermediate epitaxial layer 10, it is optional and has a thickness $h_{10}$ that can, for example, be approximately 0.2 µm, and moreover has a doping level that can be, for example, between $5 \cdot 10^{15}$ cm$^{-3}$ and $5 \cdot 10^{16}$ cm$^{-3}$. Furthermore, the intermediate epitaxial layer 10 defines an intermediate surface $S_{10}$ and performs the function of reducing the output resistance of the trench MOSFET 2.

The body 4 further includes a top epitaxial layer 12, which is made of silicon and is of a P type (for example, doped with boron). In detail, the top epitaxial layer 12 defines a top surface $S_{12}$ and extends over the intermediate surface $S_{10}$, in direct contact with the intermediate epitaxial layer 10. Furthermore, the top epitaxial layer 12 has a thickness $h_{12}$ that can be, for example, in the range approximately between 1 µm and 2 µm. In addition, the top epitaxial layer 12 has a doping level that can be, for example, in the range approximately between $1 \cdot 10^{17}$ cm$^{-3}$ and $5 \cdot 10^{17}$ cm$^{-3}$. As will emerge clearly hereinafter, in said embodiment the top epitaxial layer 12 functions as a body region.

In practice, the body 4 of semiconductor material is delimited at the top and at the bottom by the top surface $S_{12}$ and by the bottom surface $S_5$, respectively. Furthermore, the body 4 is delimited laterally by the scribe line LT, which defines a lateral surface of the body 4.

The trench MOSFET 2 further includes a first semiconductor region 14a and a second semiconductor region 14b, which are of a P+ type, extend underneath the intermediate surface $S_{10}$, and function, respectively, as a first deep body region and as a second deep body region.

In detail, the first and second semiconductor regions 14a, 14b are arranged laterally at a distance apart so as to define an internal region 16 set between them. Furthermore, the first semiconductor region 14a is arranged between the second semiconductor region 14b and the scribe line LT.

In greater detail, the first and second semiconductor regions 14a, 14b extend, starting from the intermediate surface $S_{10}$, with a depth $h_{14}$ greater than the thickness $h_{10}$, but less than $h_8 + h_{10}$. In other words, the first and second semiconductor regions 14a, 14b traverse the intermediate epitaxial layer 10 completely and extend partially within the bottom epitaxial layer 8. Furthermore, the first and second semiconductor regions 14a, 14b have an average doping level $N_{a\_14}$ such that:

$$h_{14}^2 > 2 \cdot \in \cdot E_c/(q \cdot N_{a\_14}) \quad (1)$$

where $\in$ is the absolute permittivity of silicon carbide, $E_c$ is the critical electrical field of silicon carbide, and q is the electron charge. For example, the thickness $h_{14}$ can be approximately 0.4 µm, and the average doping level $N_{a\_14}$ can be in the range approximately between $1 \cdot 10^{18}$ cm$^{-3}$ and $5 \cdot 10^{18}$ cm$^{-3}$.

The trench MOSFET 2 further includes a trench 20, which extends from the top surface $S_{12}$ and has a thickness $h_{20} > h_{12} + h_{10}$. In other words, the trench 20 extends through the top epitaxial layer 12 and the intermediate epitaxial layer 10 until it contacts the bottom epitaxial layer 8.

Furthermore, the trench 20 is arranged at a distance apart laterally with respect to the first and second semiconductor regions 14a, 14b so as to extend within the internal region 16 without contacting the first and second semiconductor regions 14a, 14b, which are approximately equidistant from the trench 20 itself.

In detail, the trench 20 is delimited by a wall 22, and the first and second semiconductor regions 14a, 14b are both at approximately a distance d from the wall 22. In practice, if we designate by $w_{20}$ the width of the trench 20 and by $w_{16}$ the width of the internal region 16, we have $w_{16} \approx w_{20} + 2d$.

The wall 22 is coated internally with a first oxide layer 24. Furthermore, present within the trench 20 is a first gate region 26, which is in direct contact with the first oxide layer 24 and is made of polysilicon.

The trench MOSFET 2 further includes a first dielectric area 30, which is arranged on the top surface $S_{12}$, is vertically aligned with the trench 20, and is in direct contact with the first oxide layer 24 and with the first gate region 26.

The trench MOSFET 2 further includes a source region 32 of an N+ type (for example, doped with phosphorus or arsenic) and with a doping level of approximately $10^{19}$ cm$^{-3}$. In detail, the source region 32 extends from the top surface $S_{12}$ and surrounds the trench 20. In addition, the source region 32 contacts the first oxide layer 24 and the first dielectric area 30. In greater detail, the source region 32 includes a first source subregion 32a and a second source subregion 32b, which extend on opposite sides with respect to the trench 20.

The integrated electronic device 1 further includes a top metallization 34 and a bottom metallization 36, as well as a gate metallization (not shown), the latter contacting the first gate region 26 in a way in itself known.

In detail, the top metallization 34 functions as source metallization and extends on the top surface $S_{12}$, in direct contact with the top epitaxial layer 12, so as to surround the first dielectric area 30. Furthermore, the source metallization 34 is in direct contact with the source region 32.

The bottom metallization 36 functions as drain metallization and extends underneath the bottom surface $S_5$ of the substrate 5, with which it is in direct contact.

Within the peripheral region 3a it is possible to distinguish an edge area E, arranged within the body 4 and housing an edge-termination structure, described hereinafter. Furthermore, within the central region 3b it is possible to distinguish an active area A, arranged within the body 4 and housing the trench MOSFET 2.

In particular, the active area A extends through the top epitaxial layer 12, the intermediate epitaxial layer 10, and part of the bottom epitaxial layer 8, and is partially delimited by the first and second semiconductor regions 14a, 14b.

In greater detail, the active area A houses a junction of the metal-oxide-semiconductor type formed by the first gate region 26, by the first oxide layer 24, and by the top epitaxial layer 12.

By biasing in a way in itself known the top metallization 34 and the gate metallization, it is possible to form a channel of an N type within the top epitaxial layer 12, and in particular in a region of the top epitaxial layer 12 arranged in direct contact with the first oxide layer 24. Furthermore, by biasing in a way in itself known the top metallization 34 and the bottom metallization 36 with a voltage $V_{DS}$, it is possible to generate a current $I_{DS}$.

The current $I_{DS}$ flows between the top metallization 34 and the bottom metallization 36; hence, it has a vertical direction and flows both through the silicon and through the silicon carbide. In particular, the current $I_{DS}$ flows within the N channel, traversing the top epitaxial layer 12. In addition, the current $I_{DS}$ traverses the substrate 5, the buffer layer 6, as well as the bottom epitaxial layer 8 and the intermediate epitaxial layer 10.

In practice, the substrate 5, the buffer layer 6, and the bottom epitaxial layer 8 function as drain region of the trench MOSFET 2, the body region of which is formed by the top epitaxial layer 12, as mentioned previously.

In the case where the voltage $V_{DS}$ is such as to reversely bias the PN junction present between the top epitaxial layer 12 and the intermediate epitaxial layer 10, and hence also the PN junction present between the bottom epitaxial layer 8 and the first and second semiconductor regions 14a, 14b, the magnitude of the voltage $V_{DS}$ cannot exceed a maximum voltage $V_{max}$; otherwise, a phenomenon of breakdown is triggered within the trench MOSFET 2.

In particular, the maximum voltage $V_{max}$ is particularly high thanks to the presence, within the intermediate epitaxial layer 10 and part of the bottom epitaxial layer 8, of the first and second semiconductor regions 14a, 14b.

In fact, assuming for reasons of simplicity that the source region 32 and the first gate region 26 are short-circuited, the thickness $h_{14}$ and the doping of the first and second semiconductor regions 14a, 14b are such that the voltage $V_{DS}$ falls substantially within the first and second semiconductor regions 14a, 14b, as well as within the bottom epitaxial layer 8 and the buffer layer 6. In other words, a significant nonzero electrical field is generated only within the first and second semiconductor regions 14a, 14b, the bottom epitaxial layer 8, and the buffer layer 6; instead, within the top epitaxial layer 12, the electrical field is to a first approximation negligible. Consequently, the maximum voltage $V_{max}$ is limited at the top, instead of by the critical electrical field of silicon, by the critical electrical field of silicon carbide, which, as has been said, is higher than the critical electrical field of silicon.

In greater detail, as regards the top epitaxial layer 12, the electrical field present therein is negligible not only in the proximity of the first and second semiconductor regions 14a, 14b, but also in the proximity of the internal region 16, i.e., where the top epitaxial layer 12 is not in direct contact with the first and second semiconductor regions 14a, 14b.

In fact, as illustrated qualitatively in FIG. 1, underneath the first and second semiconductor regions 14a, 14b, the equipotential lines L that are generated within the trench MOSFET 2 are approximately parallel to the first and second semiconductor regions 14a, 14b. Instead, in the internal region 16, the equipotential lines L bend, on account of the presence of the trench 20, and in particular of the first oxide layer 24, in such a way that the electrical field itself assumes a direction to a first approximation parallel to the intermediate surface $S_{10}$.

From a more quantitative standpoint, in order to reduce the electrical field present in the portions of top epitaxial layer 12 arranged facing the internal region 16, it is possible to impose $d<h_8$.

The integrated electronic device 1 further includes a first dielectric region 40, which extends above the intermediate surface $S_{10}$, in direct contact with the intermediate epitaxial layer 10 and with a thickness $h_{40}$, which, as illustrated in the embodiment of FIG. 1, can be approximately equal to the thickness $h_{12}$.

In detail, the first dielectric region 40 can be made, for example, of silicon oxide, or else silicon nitride, or else a combination of silicon oxide and silicon nitride. Furthermore, the first dielectric region 40 extends above the intermediate surface $S_{10}$ so as to be coplanar with respect to the top epitaxial layer 12, by which it is surrounded. In other words, the first dielectric region 40 defines a first portion 12a and a second portion 12b of the top epitaxial layer 12, which are arranged laterally at a distance apart and between which the first dielectric region 40 extends. In practice, the active area A extends in the second portion 12b, whilst the first portion 12a is delimited by the scribe line LT in such a way that the first dielectric region 40 is arranged between the active area A and the scribe line LT, i.e., between the active area A and the lateral surface of the body 4.

In greater detail, the first dielectric region 40 is laterally staggered and is partially arranged on top of the first semiconductor region 14a, with which it is in direct contact. In particular, the first dielectric region 40 is arranged on top of the first semiconductor region 14a for a width x, for example, in the range approximately between 0.5 μm and 5 μm.

Extending on top of the first dielectric region 40 is a second dielectric region 42 made, for example, of borophosphosilicate glass (BPSG). In particular, the second dielectric region 42 is in direct contact with the first dielectric region 40 and extends laterally so as to overlie partially also the first and second portions 12a, 12b of the top epitaxial layer 12, with which it is in direct contact. In turn, the second dielectric region 42 is overlaid in part by the top metallization 34, with which it is in direct contact. Furthermore, the top metallization 34 is arranged between the first dielectric area 30 and the second dielectric region 42.

The integrated electronic device 1 further includes an equipotential ring (EQR) 50 made of metal material, which extends on the top surface $S_{12}$ and is coupled to the bottom metallization 36 through the first portion 12a of the top epitaxial layer 12. Consequently, the equipotential ring 50 is, in use, at the same potential as the bottom metallization 36, but for the voltage drop due to the built-in voltage that sets up between the first portion 12a and the intermediate epitaxial layer 10.

In greater detail, the equipotential ring 50 partially overlies the second dielectric region 42, with which it is in direct contact, and contacts the first portion 12a of the top epitaxial layer 12, being, instead, separate from the top metallization 34.

In practice, the first dielectric region 40 forms a partially buried edge-termination structure such that, in use, the equipotential lines L assume the pattern illustrated qualitatively in FIG. 1. In particular, in the first dielectric region 40, the equipotential lines L are inclined with respect to the intermediate surface $S_{10}$ and to the top surface $S_{12}$ so as to traverse said first dielectric region 40. The electrical field thus remains confined within the first dielectric region 40, without penetrating within the first and second portions 12a, 12b of the top epitaxial layer 12. Consequently, onset of the phenomenon of breakdown within the top epitaxial layer 12 is prevented, even in the peripheral region 3a of the die 3.

As regards the second dielectric region 42, this bestows strength on the edge-termination structure and functions as a protective element in regard to possible external contaminating agents.

As regards, instead, the first portion 12a of the top epitaxial layer 12, this could be absent; i.e., the first dielectric region 40 could extend up to the scribe line LT; however, its presence prevents the presence of a large thickness of dielectric material at the scribe line LT.

Figure 2:
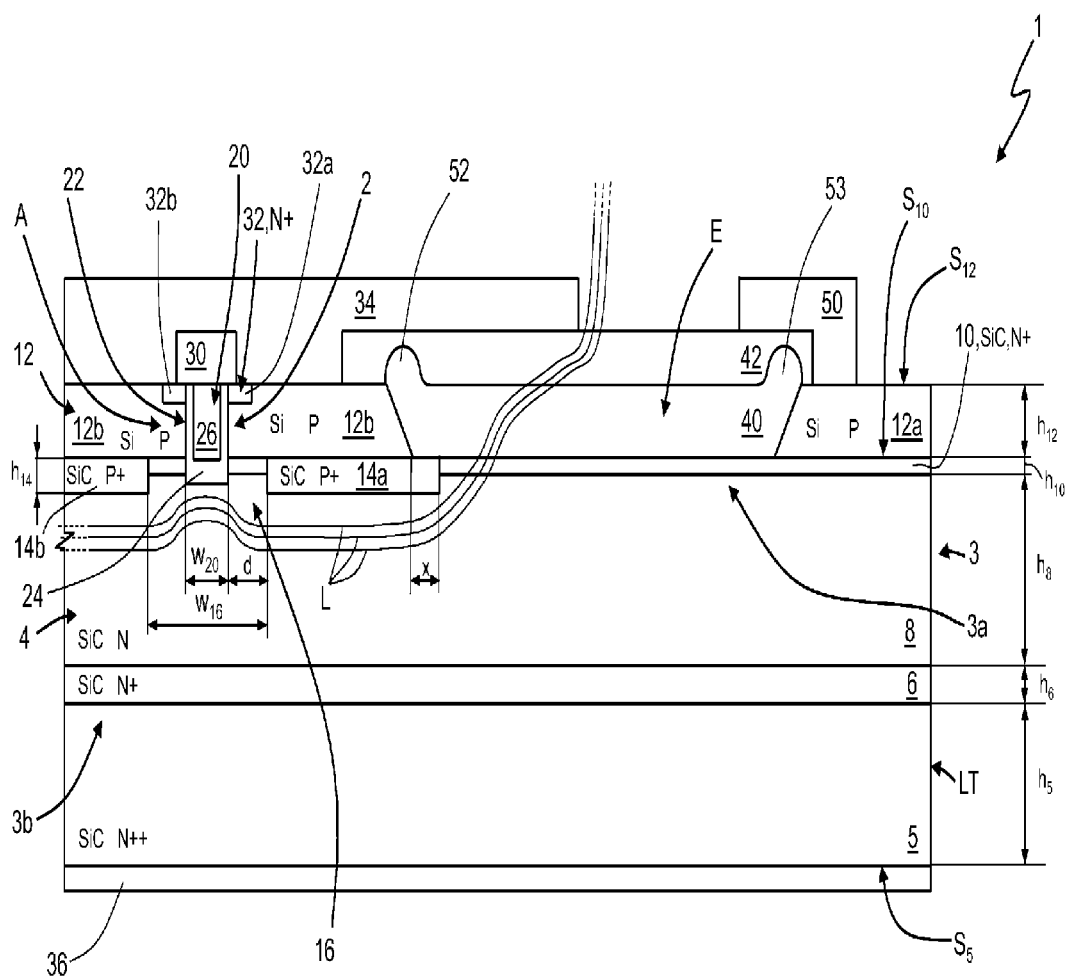

As illustrated in FIG. 2, according to a different embodiment, the first dielectric region 40 defines a first protuberance 52 and a second protuberance 53, arranged on respective edges of the first dielectric region 40, raised with respect to the top surface $S_{12}$ and surrounded by the second dielectric region 42.

Figure 3:
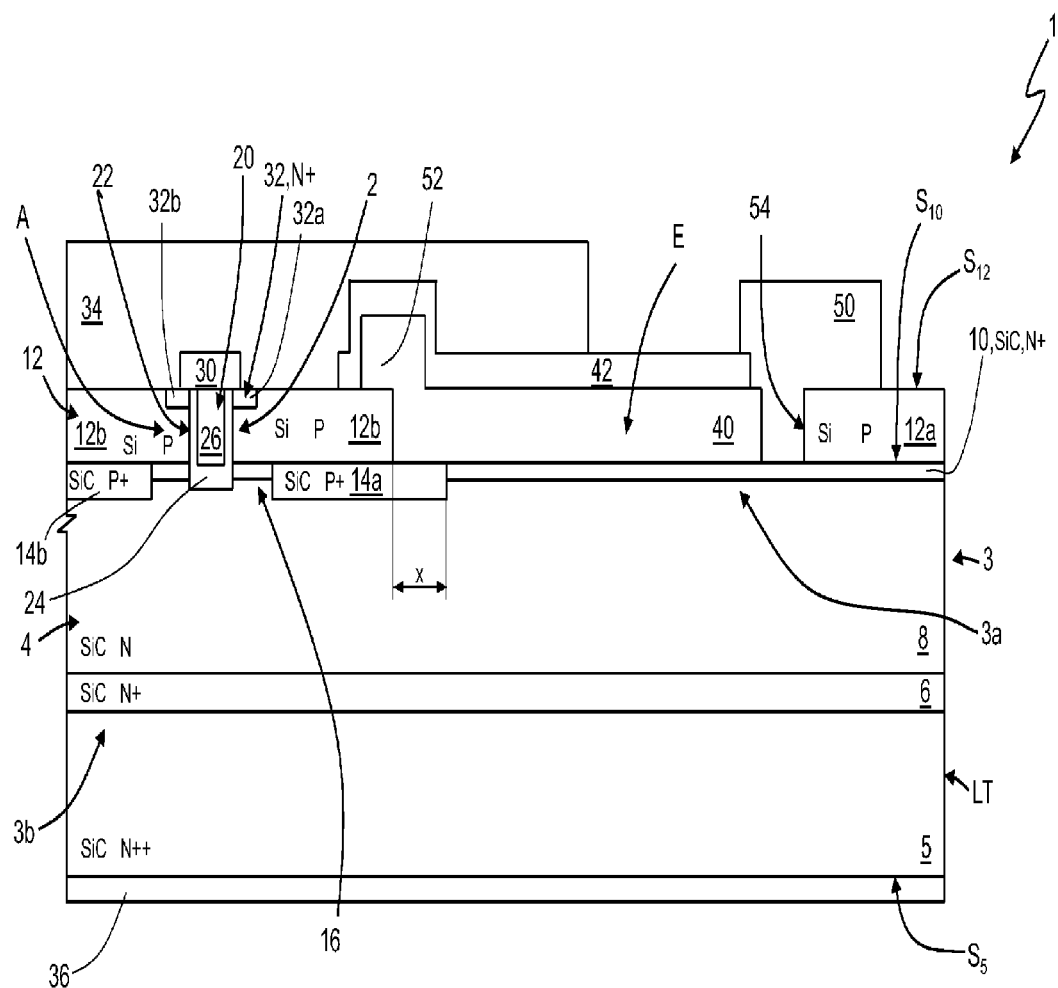

As illustrated in FIG. 3, according to yet a further embodiment, the first dielectric region 40 is partially arranged on top of the second portion 12b of the top epitaxial layer 12 in such a way that the first protuberance 52 extends over the top surface $S_{12}$. The second protuberance 53, instead, is absent.

In said embodiment, the second dielectric region 42 extends so as to surround the protuberance 52 in order to prevent contact between the first dielectric region 40 and the top metallization 34. Furthermore, the first dielectric region 40 does not contact the first portion 12a of the top epitaxial layer 12. In other words, between the first dielectric region 40 and the first portion 12a a first gap 54 is present, extending within which is the equipotential ring 50. In use, unlike what is illustrated in FIG. 1, the equipotential ring 50 is at the same potential as the bottom metallization 36, without any voltage drop occurring due to the built-in voltage that sets up between the first portion 12a and the intermediate epitaxial layer 10.

Figure 4:
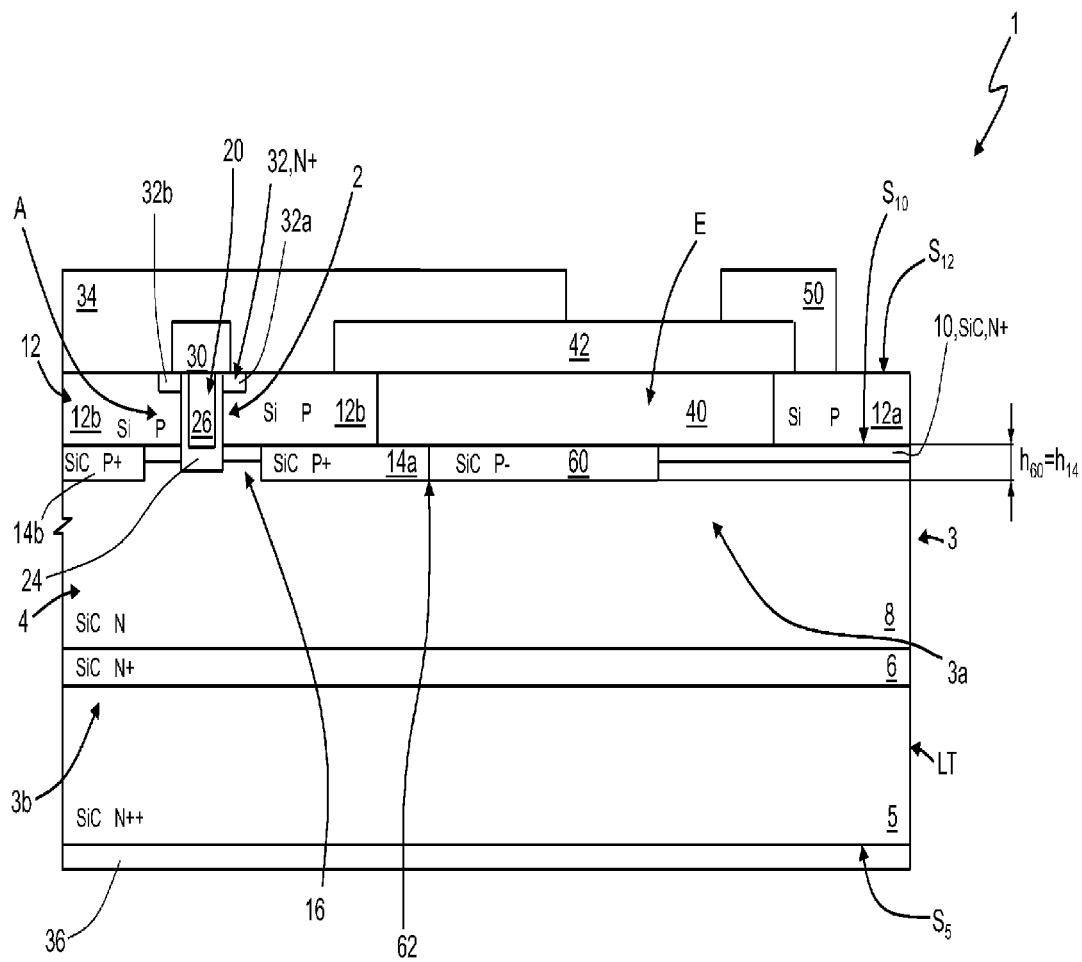

As illustrated in FIG. 4, according to a different embodiment, the integrated electronic device 1 is of the type illustrated in FIG. 1 and further includes a confinement region 60 of a P– type (for example, doped with aluminium), which extends through the intermediate epitaxial layer 10, starting from the intermediate surface $S_{10}$, with a thickness $h_{60}$ approximately equal, for example, to the thickness $h_{14}$ of the first and second semiconductor regions 14a, 14b.

In greater detail, the confinement region 60 has a doping level at least approximately equal to the doping level of the bottom epitaxial layer 8, and lower than the doping level of the first and second semiconductor regions 14a, 14b. Furthermore, the confinement region 60 extends between the first semiconductor region 14a, with which it is in direct contact, and the scribe line LT, and is entirely overlaid by the first dielectric region 40, with which it is in direct contact. In addition, the confinement region 60 extends at a distance from the scribe line LT. Once again, as illustrated in the embodiment of FIG. 4, the confinement region 60 can be staggered laterally with respect to the equipotential ring 50 in such a way that the equipotential ring 50 does not overlap the confinement region 60.

In practice, if we designate by 62 a region of curvature of the first semiconductor region 14a having approximately the shape of a corner and delimiting a portion of the first semiconductor region 14a facing the scribe line LT, the confinement region 60 enables reduction of the electrical field, which, in the absence of the confinement region 60, would be localized in the region of curvature 62.

Even though they are not shown, likewise possible are embodiments of the type illustrated in FIGS. 2 and 3, and moreover provided with the confinement region 60 described previously. Furthermore, within the active area A, the integrated electronic device 1 can form, instead of the trench MOSFET 2, a different elementary electronic component, such as for example a junction diode, a power MOS transistor, an insulated-gate bipolar transistor (IGBT), etc. Purely by way of example, FIG. 5 shows an embodiment in which the integrated electronic device 1 forms, within the active area A, a planar-cell MOSFET 70.

Figure 5:
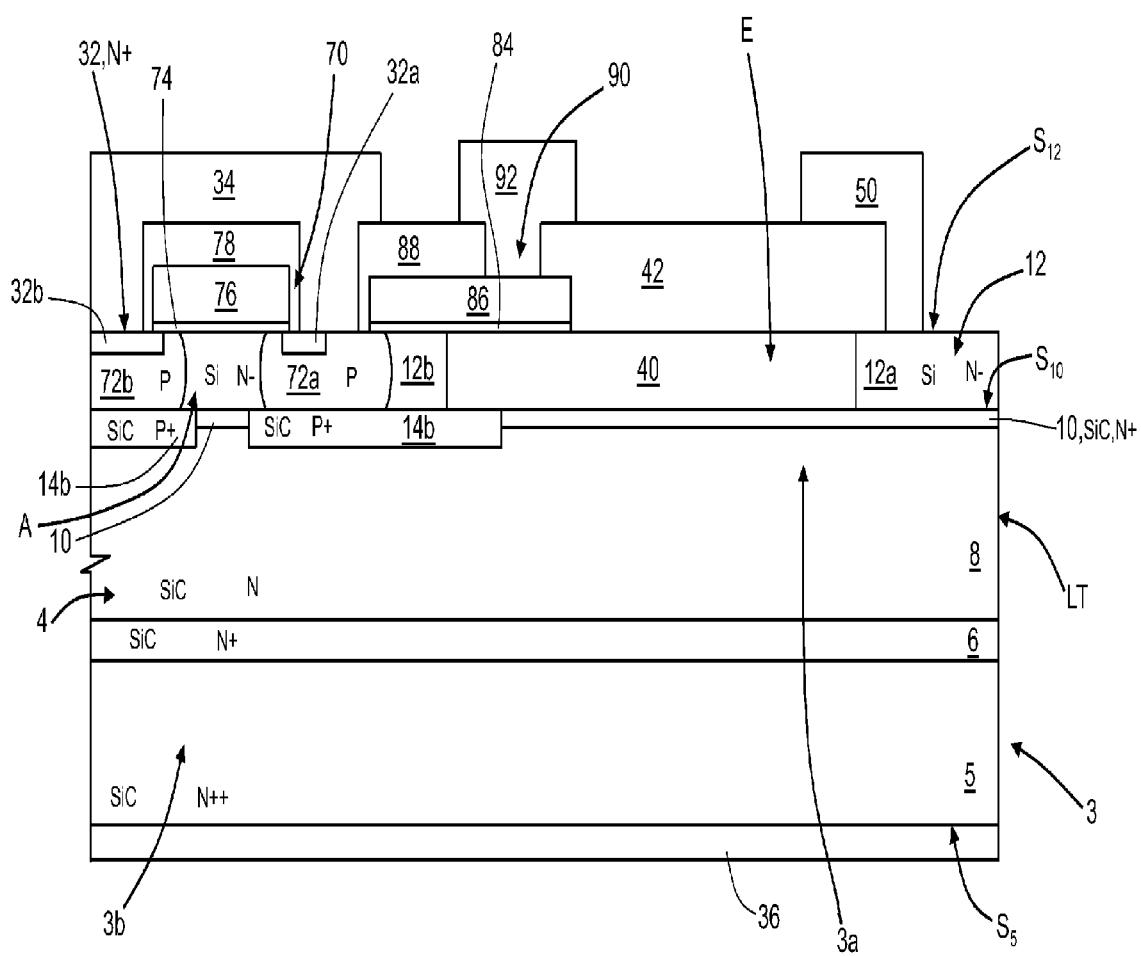

In particular, with reference to FIG. 5, elements present therein and already present in FIG. 1 are designated by the same reference numbers. Furthermore, the ensuing description is limited to the differences with respect to the embodiment illustrated in FIG. 1.

In detail, the top epitaxial layer 12 is of an N– type (for example, doped with phosphorus) and has a doping level for example of approximately $10^{15}$ cm$^{-3}$. Furthermore, extending within the active area A are a first top region 72a and a second top region 72b of a P type (for example, doped with boron), which function, respectively, as first and second body regions.

In detail, the first and second top regions 72a, 72b have a doping level comprised, for example, approximately between $5·10^{16}$ cm$^{-3}$ and $5·10^{17}$ cm$^{-3}$. Furthermore, the first and second top regions 72a, 72b are arranged laterally at a distance apart and are arranged, respectively, underneath and in direct contact with the first and second source subregions 32a, 32b. In practice, the first source subregion 32a is arranged between the first dielectric region 40, from which it is laterally spaced apart, and the second source subregion 32b.

In greater detail, the first and second top regions 72a, 72b surround, respectively, the first and second source subregions 32a, 32b, and extend vertically through the top epitaxial layer 12 starting from the top surface $S_{12}$, until they contact the first and second semiconductor regions 14a, 14b, respectively.

Extending on the top surface $S_{12}$ is a second oxide layer 74. In particular, the second oxide layer 74 extends on top of and in direct contact with a portion of the top epitaxial layer 12 arranged between the first and second source subregions 32a, 32b, which are overlaid in part by said second oxide layer 74.

Extending on top of and in direct contact with the second oxide layer 74 is a second gate region 76, made of polysilicon and overlaid, in turn, by a second dielectric area 78. In particular, the second dielectric area 78 surrounds both the second oxide layer 74 and the second gate region 76, and moreover contacts the first and second source subregions 32a, 32b.

Extending moreover on the top surface $S_{12}$ is a third oxide layer 84, which extends, in particular, on top of and in direct contact with a portion of the top epitaxial layer 12 arranged between the first top region 72a and the first dielectric region 40. Furthermore, both the first top region 72a and the first dielectric region 40 are in part overlaid by the third oxide layer 84, with which they are in direct contact.

Extending on top of and in direct contact with the third oxide layer 84 is a third gate region 86, made of polysilicon and overlaid in part by a third dielectric area 88.

In detail, the third gate region 86 is coupled, in a way in itself known and consequently not illustrated, to the second gate region 76. Furthermore, the third dielectric area 88 is laterally spaced apart from the second dielectric region 42 so as to define a second gap 90, extending within which is a gate metallization 92 of the planar-cell MOSFET 70. The gate metallization 92 overlaps the second dielectric region 42, and the third dielectric area 88 contacts the third gate region 86 and is decoupled from the top metallization 34.

In turn, the top metallization 34 surrounds the second dielectric area 78 and is decoupled from the third oxide layer 84 and from the third gate region 86 thanks to the interposition of the third dielectric area 88. In practice, the top metallization 34 functions as source metallization, whilst the bottom metallization 36 functions as drain metallization.

An embodiment of the present integrated electronic device can be obtained using the manufacturing method described in what follows and represented in FIGS. 6-20. By way of example, and without this implying any loss of generality, described in what follows are the operations regarding manufacture of the embodiments illustrated in FIGS. 1, 2, 3 and 4. In particular, with regard to the embodiment illustrated in FIG. 4, the corresponding manufacturing process functions as an example, in general, for obtaining the embodiments provided with the confinement region 60.

As illustrated in FIG. 6, to obtain the embodiment illustrated in FIG. 1, the substrate 5 is provided, and then the buffer layer 6, the bottom epitaxial layer 8, and the intermediate epitaxial layer 10 are formed. In particular, also the buffer layer 6 can be formed by means of epitaxial growth.

Next (FIG. 7), using a first mask 100 made of an appropriate material, for example, silicon oxide or silicon nitride deposited with chemical-vapor-deposition (CVD) techniques, a sequence of implants of dopant species of a P type (for example, aluminium atoms) is executed (represented by the arrows 102) so as to localize the dopant species in a first thin layer 14a' and a second thin layer 14b' of a P+ type, which are arranged underneath the intermediate surface $S_{10}$ and are to form, respectively, the first and second semiconductor regions 14a, 14b.

In particular, the sequence of implants is formed by one or more successive implants, obtained using the same first mask 100. In greater detail, each implant of the sequence of implants is executed with a hot process, i.e., at a temperature higher than approximately 400° C. in order to limit the defects introduced during the implant itself within the crystalline lattice of the silicon carbide. In addition, each implant can be made at a dosage of approximately between $1 \cdot 10^{15}$ cm$^{-2}$ and $1 \cdot 10^{16}$ cm$^{-2}$ and within an energy range of approximately between 20 keV and 200 keV.

Next (FIG. 8), the first mask 100 is removed, and an annealing is performed at a temperature of approximately between 1400° C. and 1850° C. and of a duration of approximately between 10 and 100 minutes, in order to reduce the sites of the bottom epitaxial layer 8 and of the intermediate epitaxial layer 10 damaged following upon the previous ion-implantation process, as well as to activate the dopant species. In practice, the annealing is carried out at a temperature sufficient to activate an appropriate amount of dopant in such a way that the first and second thin layers 14a', 14b' form, respectively, the first and second semiconductor regions 14a, 14b.

Next (FIG. 9), the top epitaxial silicon layer 12 is formed by heteroepitaxy.

Next (FIG. 10), using a second resist mask 104, a (dry or wet) chemical etch is performed for selective removal of a portion of the top epitaxial layer 12, thus defining a first window 106 and the first and second portions 12a, 12b of the top epitaxial layer 12. In particular, the first window 106 is arranged between the first and second portions 12a, 12b, and is to house the first dielectric region 40. In greater detail, the chemical etch has as an end-point the silicon carbide in such a way that, in an area corresponding to the first window 106, the silicon is removed almost entirely to entirely.

Next (FIG. 11), the second resist mask 104 is removed, and a first dielectric layer 40' is deposited, which is to form the first dielectric region 40. The first dielectric layer has a thickness sufficient to fill the first window 106 entirely; hence, it has a thickness greater than the thickness $h_{12}$, and can be formed in turn by a plurality of dielectric substrates (not shown).

Next (FIG. 12), a chemical mechanical polishing (CMP) is performed in order to remove portions of the first dielectric layer 40' arranged on the outside of the first window 106, thus forming the first dielectric region 40.

In a way in itself known and hence not illustrated, there are then formed the source region 32, the trench 20, the first oxide layer 24, the first gate region 26, the first dielectric region 30, and the second dielectric region 42, as well as the top metallization 34, the gate metallization, and the bottom metallization 36. Finally, in a way in itself known, a position of the scribe line LT is determined, and the die 3 is cut, to obtain the integrated electronic device illustrated in FIG. 1. In what follows, for reasons of brevity, said aforementioned operations (not illustrated in detail) are referred to as "final operations".

With regard to the embodiment illustrated in FIG. 2, to obtain it according to an embodiment the operations illustrated in FIGS. 6-9 are performed, and subsequently (FIG. 13) an (optional) buffer oxide layer 110 and a silicon-nitride layer 112 are formed on the top surface $S_{12}$. In particular, the buffer oxide layer 110 performs the function of limiting the mechanical stresses introduced into the top epitaxial layer 12 during the operations described hereinafter.

Next (FIG. 14), by using a third resist mask 120, a chemical etch is performed for selective removal of a portion of the silicon-nitride layer 112 to define a second window 126 that is to house the first dielectric region 40, as described hereinafter.

Next (FIG. 15), a further chemical etch is performed, self-aligned with the previous chemical etch, i.e., obtained using the third resist mask 120, and having the aim of selectively removing a portion of the buffer oxide layer 110 (if present) and a portion of the top epitaxial layer 12, both of which underlie the second window 126. In practice, by so doing, the second window 126 increases in thickness.

At the end of the further chemical etch, the second window 126 extends within the top epitaxial layer 12 with a thickness $h_{126}$ (calculated starting from the top surface $S_{12}$) at most equal to approximately $h_{12}-h_{40}/2$, in such a way that the window 126 does not reach the underlying silicon carbide; for example, in the case where $h_{40}=h_{12}$, the thickness $h_{126}$ can be approximately half of the thickness $h_{12}$ of the top epitaxial layer 12. Consequently, underneath the second window 126, the top epitaxial layer 12 defines a residual portion 12c of silicon.

Next (FIG. 16), the entire residual portion 12c is thermally oxidized, thus forming the first dielectric region 40, which, on account of the greater volume of the silicon oxide with respect to the silicon, likewise forms the first and second protuberances 52, 53. In this way, the first dielectric region 40 is in direct contact with the intermediate surface $S_{10}$ defined by the intermediate epitaxial layer 10. The silicon-nitride layer 112 and the buffer oxide layer 110 (if it is present) are then removed, and finally the aforementioned final operations are performed.

As regards, instead, the embodiment illustrated in FIG. 3, to obtain it the operations illustrated in FIGS. 6-11 are performed, and subsequently (FIG. 17) a chemical etch is carried out using a fourth resist mask 140. In particular, the fourth resist mask 140 is set, with respect to the second resist mask 104 used previously, in such a way that the first dielectric region 40 defines the first gap 54 and the first protuberance 52, which extends over the top surface $S_{12}$.

Next, the fourth resist mask 140 is removed, and the aforementioned final operations are performed.

Finally, as regards the embodiment illustrated in FIG. 4, to obtain it the operations illustrated in FIGS. 6 and 7 are performed.

Next (FIG. 18), hence before carrying out annealing at a temperature of approximately between 1400° C. and 1850° C., an implantation of dopant species of a P type (for example, aluminium), represented by the arrows 152, is performed by means of a fifth mask 150 so as to localize the dopant species in a third thin layer 60' of a P− type, which is arranged underneath the intermediate surface $S_{10}$, in contact with the first thin layer 14a', and is to form the confinement region 60. In greater detail, the fifth mask 150 can be formed starting from the first mask 100, by means of selective removal of a portion of said first mask 100. Furthermore, said implant can be made with a dosage comprised in the range approximately between $1 \cdot 10^{12}$ cm$^{-2}$ and $-5 \cdot 10^{13}$ cm$^{-2}$ and with an energy in the range approximately between 20 keV and 200 keV, as well as at a temperature of approximately 400° C. In particular, the dosage is such that no appreciable alteration of the doping level of the first and second thin layers 14a', 14b' occurs.

Next (FIG. 19), the fifth mask 150 is removed, and annealing is performed at a temperature of approximately between 1400° C. and 1850° C. in such a way that the first, second, and third thin layers 14a', 14b' and 60' form, respectively, the first semiconductor region 14a, the second semiconductor region 14b, and the confinement region 60.

Next, the operations illustrated in FIGS. 9-12 and the final operations are performed.

Figure 8:
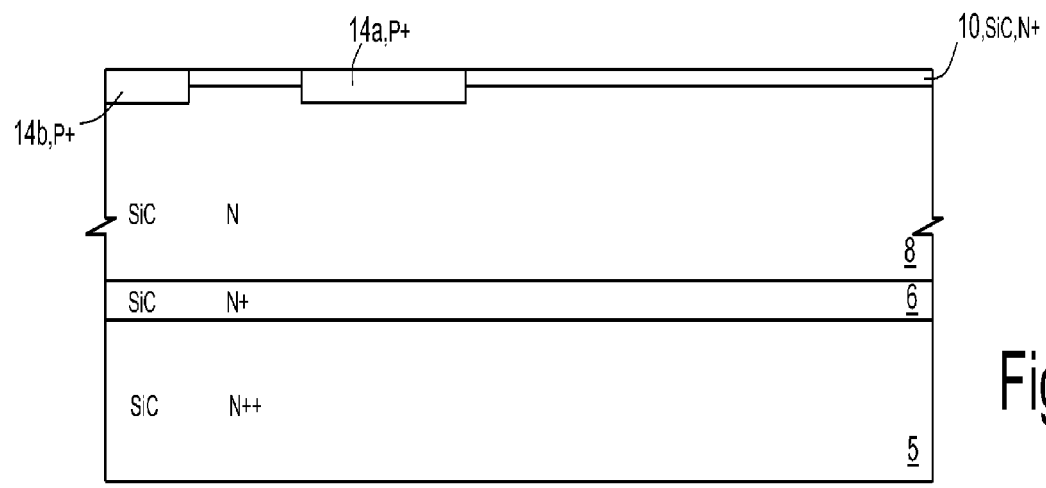
Figure 9:
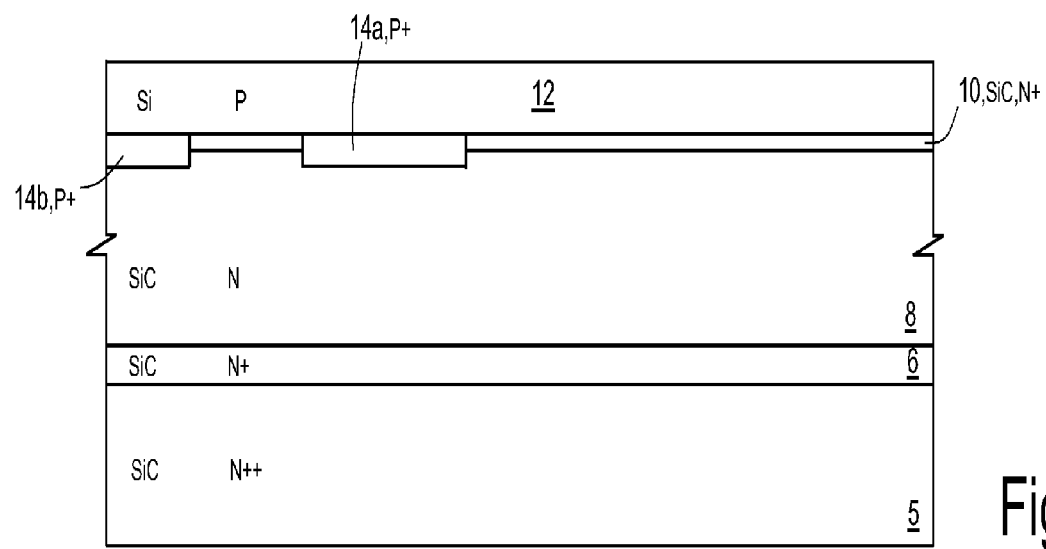
Figure 10:
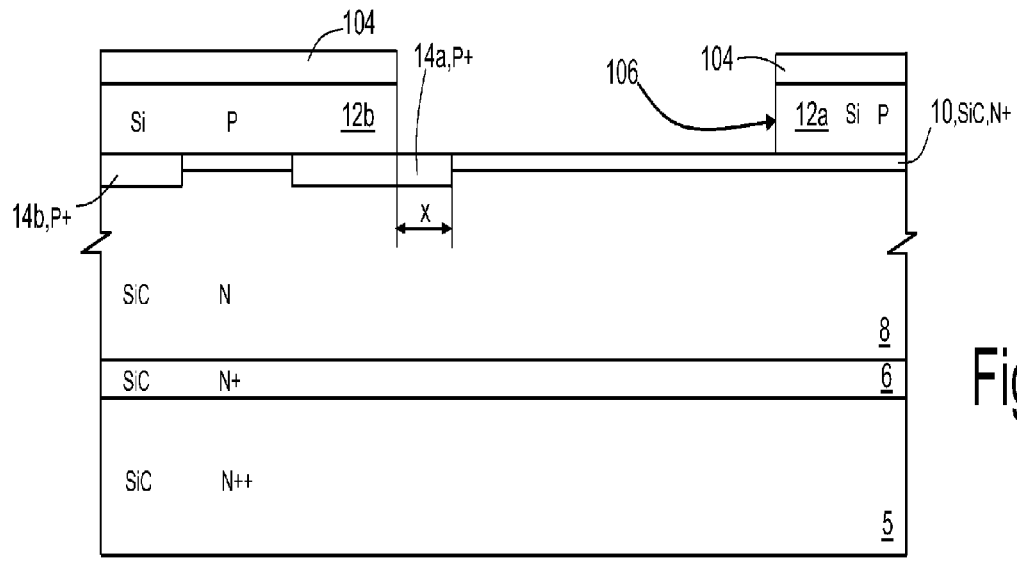
Figure 11:
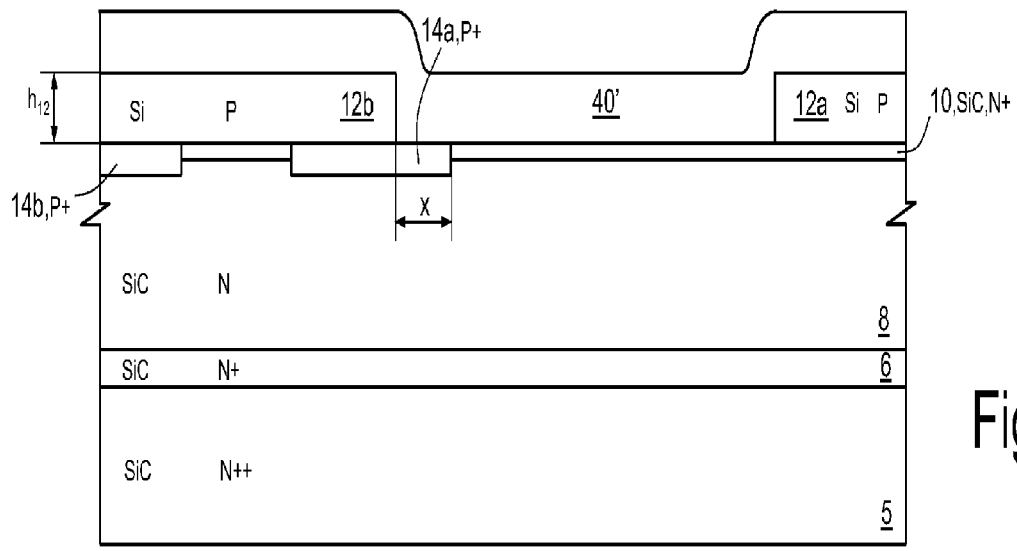
Figure 12:
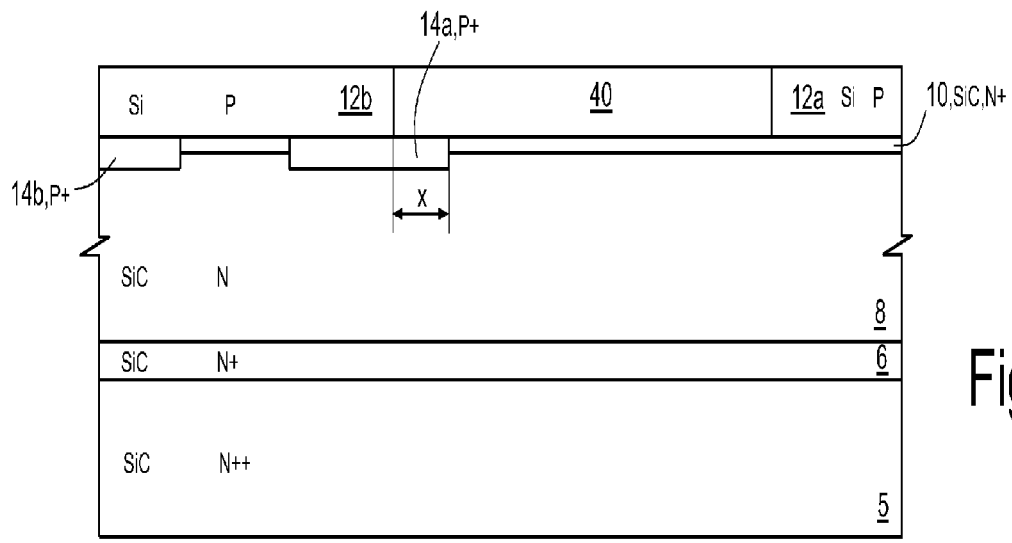
Figure 13:
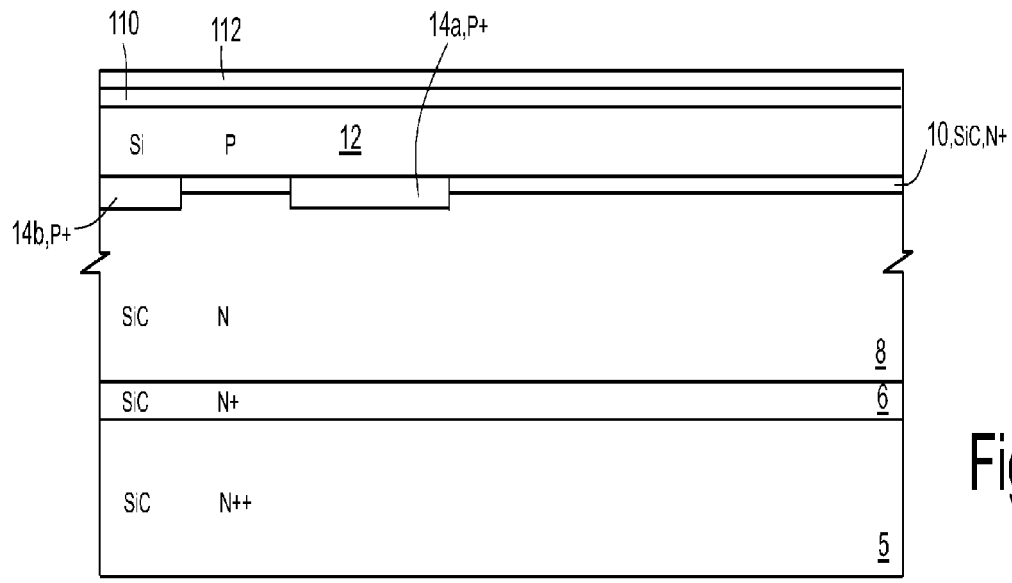
Figure 14:
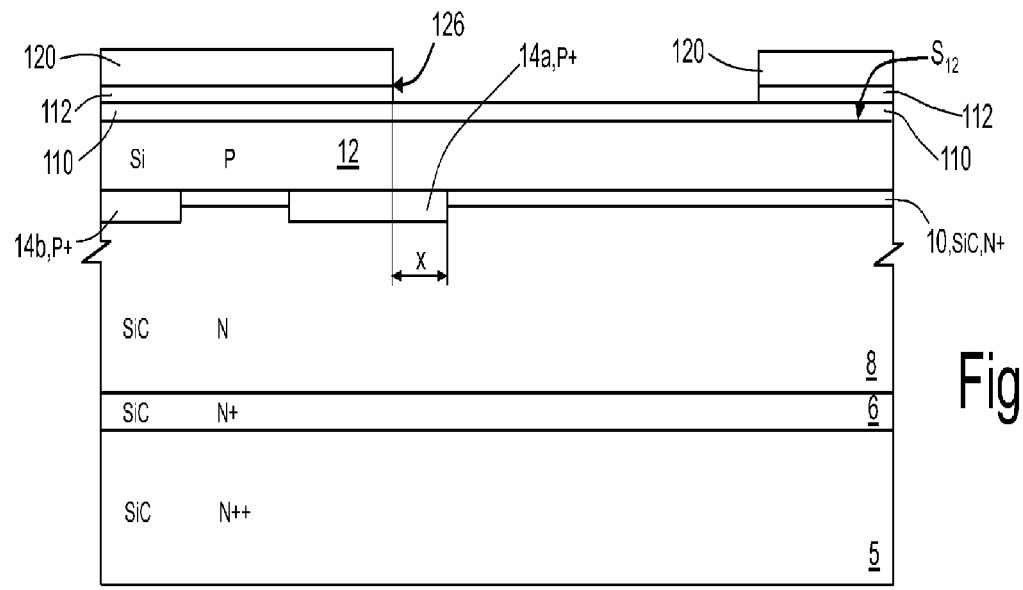

Alternatively, once again to obtain the embodiment illustrated in FIG. 4, it is possible to perform the operations illustrated in FIGS. 6-8, and subsequently (FIG. 20), hence after having removed the first mask 100 and having performed annealing at a temperature of approximately between 1400° C. and 1850° C., to execute, by means of a sixth mask 160, an implantation of dopant species of a P type (for example, boron). Said implant, represented by the arrows 162, performs the function of forming the aforementioned third thin layer 60'.

In greater detail, said implant can be made at approximately room temperature, with a dosage comprised in the range approximately between $5 \cdot 10^{14}$ cm$^{-2}$ and $5 \cdot 10^{15}$ cm$^{-2}$ and with an energy in the range approximately between 20 keV and 200 keV. Furthermore, the sixth mask 160 is set, with respect to the first mask 100 used previously, so as to enable implantation of dopant species also in a portion of the first semiconductor region 14a facing the third thin layer 60'. In this way, any possible misalignment between the sixth mask 160 and the first mask 100 is avoided so that the third thin layer 60' does come into contact with the first semiconductor region 14a.

Next, the operations illustrated in FIGS. 9-12 and the final operations are performed.

In practice, according to the latter embodiment, the confinement region 60 coincides with the third thin layer 60'; hence, formation of this confinement region 60 does not involve any annealing. Consequently, the confinement region 60 has a high degree of defectiveness, which enables further reduction of the electrical field in the proximity of the region of curvature 62.

Advantages that embodiments of the present integrated electronic device and the present manufacturing method afford emerge clearly from the foregoing discussion.

In detail, an embodiment of the present integrated electronic device resorts to a buried edge-termination structure, which enables prevention of generation of appreciable electrical fields within the top epitaxial layer 12, also in the proximity of the scribe line LT. In particular, an embodiment of the present integrated electronic device is less subject, as compared to traditional devices, to the onset of the phenomenon of breakdown, also in conditions of inhibition, i.e., when the top metallization 34 and the bottom metallization 36 are biased in such a way that the PN junction present between the top epitaxial layer 12 and the intermediate epitaxial layer 10 is reversely biased.

Finally, it is evident that modifications and variations may be made to embodiments of the present integrated electronic device and manufacturing method, without thereby departing from the scope of the present disclosure.

Purely by way of example, it is possible to reverse all the types of the semiconductor elements described, and/or use different semiconductor materials, for example using germanium instead of silicon, or else, once again by way of example, using germanium instead of silicon and silicon instead of silicon carbide. Furthermore, the semiconductor material which forms the substrate 5 can be chosen in a way independent of the semiconductor materials that form the buffer layer 6, the bottom epitaxial layer 8, the intermediate epitaxial layer 10 (if it is present), and the top epitaxial layer 12.

Figure 15:
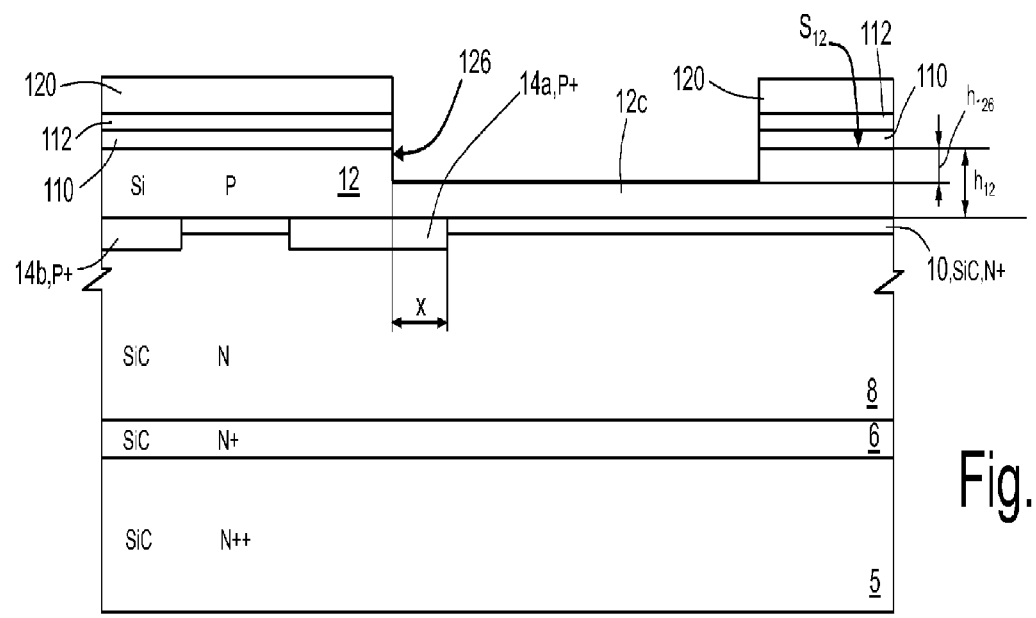
Figure 16:
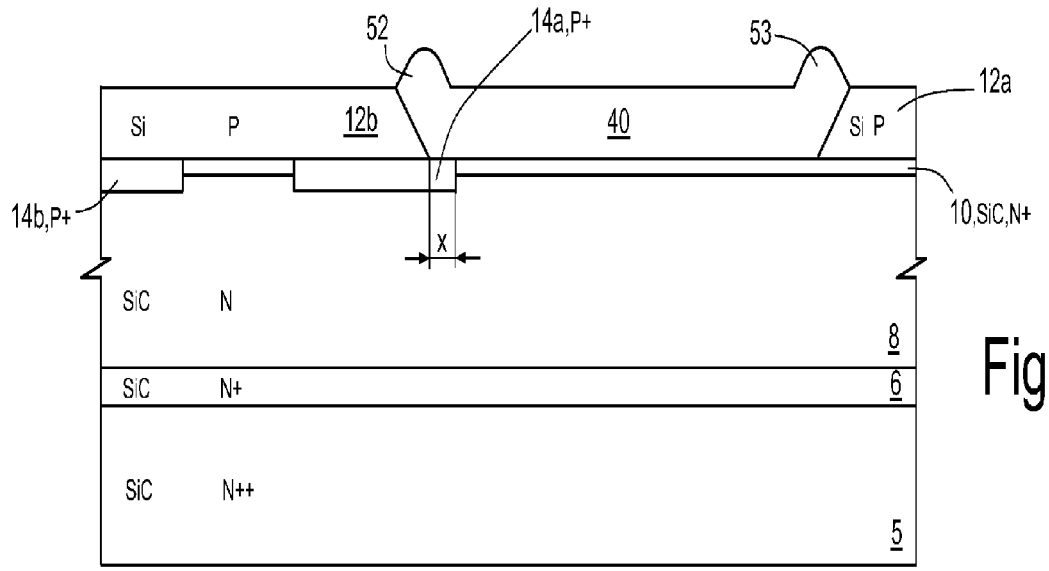
Figure 17:
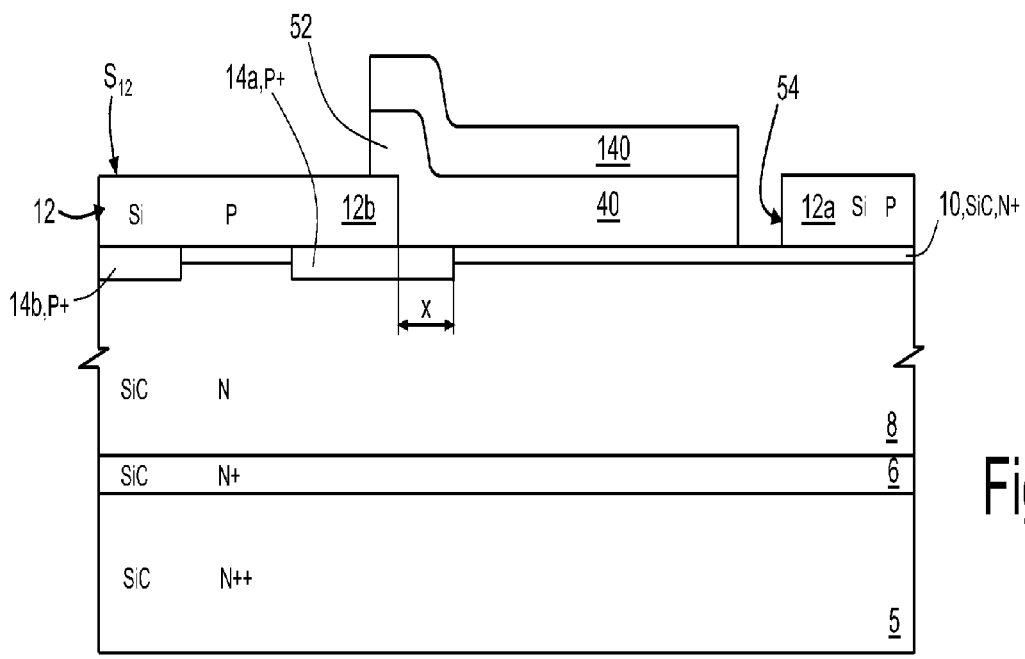
Figure 18:
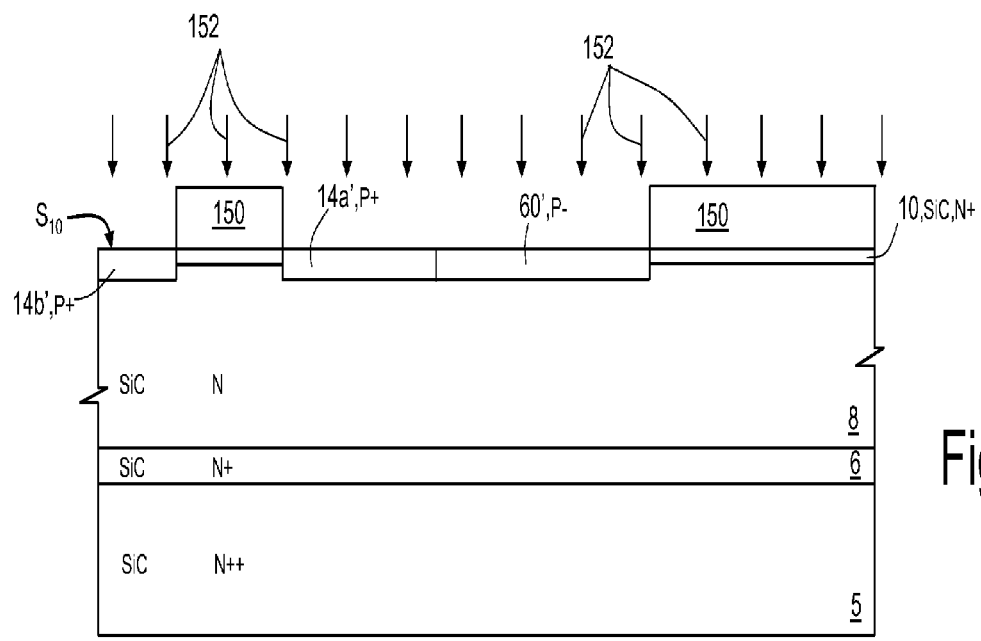
Figure 19:
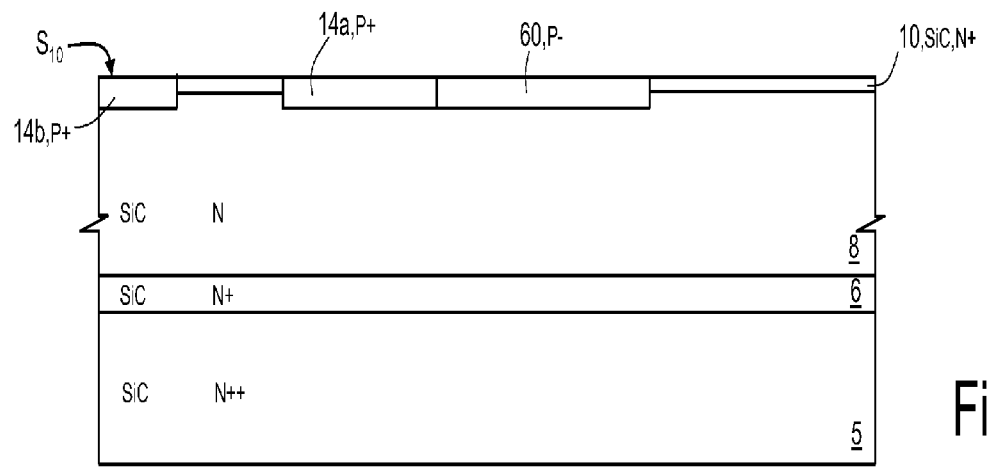
Figure 20:
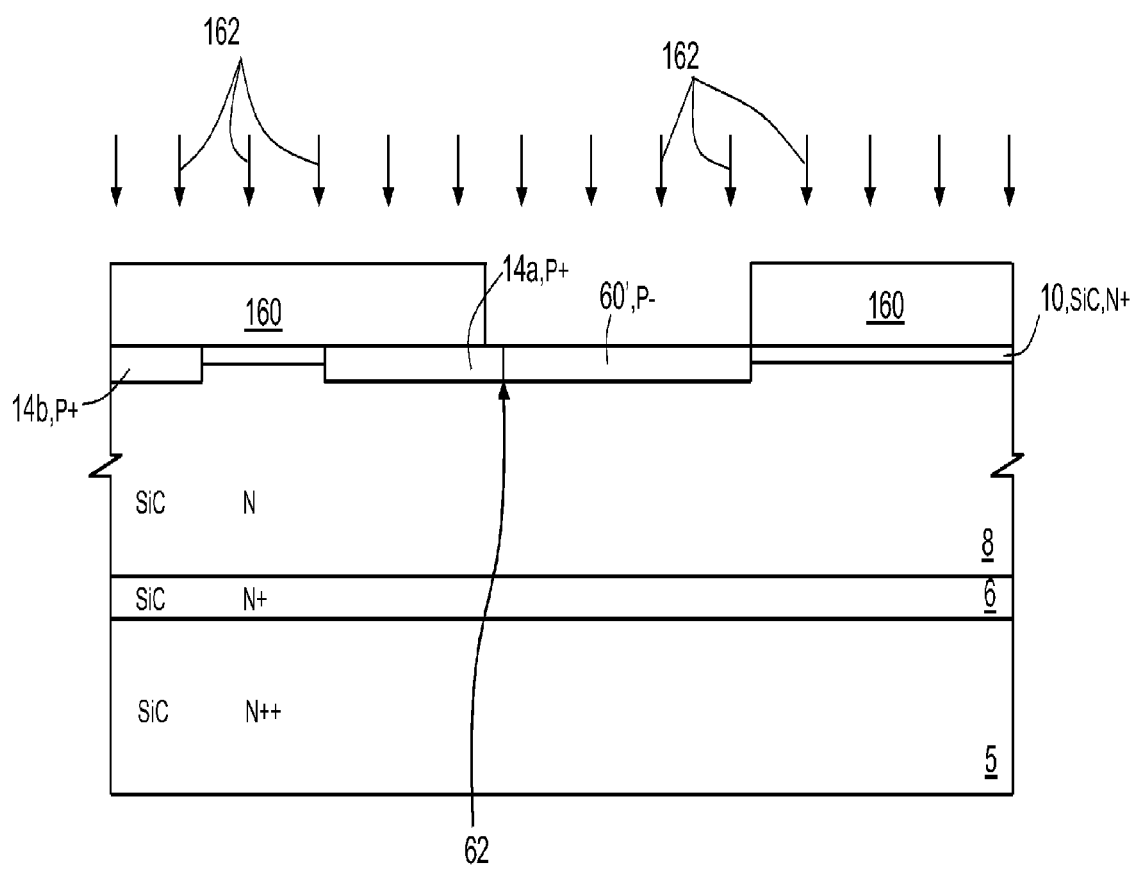

Furthermore, with regard to an embodiment of the manufacturing method, it is for example possible that the operations illustrated in FIG. 15 are such that the second window 126 does not extend within the top epitaxial layer 12; i.e., they are such that $h_{126}=0$. The residual portion 12c hence has a thickness equal to the entire thickness $h_{12}$ of the top epitaxial layer 12, and consequently the first dielectric region 40, which is generated following upon the process of thermal oxidation of the entire residual portion 12c, has a thickness $h_{40}$ greater than the thickness $h_{12}$.

Moreover, an embodiment of the above-described electronic device may form part of an integrated circuit, which may be combined with one or more other integrated circuits on a same or on different dies to form a system. At least one of the integrated circuits may include a controller such as a processor.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method for making a semiconductor structure comprising:
    forming a first semiconductor layer over a substrate and having a first bandgap;
    forming a second semiconductor layer over the first semiconductor layer and having a second bandgap less than the first bandgap;
    forming a transistor region having a plurality of source regions, and a gate region in the second semiconductor layer, and a drain region vertically spaced apart from the second semiconductor layer;
    forming a drain contact adjacent the drain region; and
    forming an edge region comprising
        a first insulator layer over the first semiconductor layer between and coplanar with the transistor region,
        a second insulator layer over the first insulator layer, and
        an equipotential metallic ring layer surrounding the transistor region and extending over the second semiconductor layer and the second insulator layer and being electrically coupled to the drain contact.

2. The method of claim 1, wherein forming the first semiconductor layer comprises forming a first epitaxial layer; and wherein forming the second semiconductor layer comprises forming a second epitaxial layer.

3. The method of claim 1, wherein the first semiconductor layer comprises silicon carbide; and wherein the second semiconductor layer comprises silicon.

4. The method of claim 1, further comprising forming an opening in the second semiconductor layer between the transistor and edge regions; and wherein the first insulator layer is in the opening.

5. The method of claim 1, wherein the first insulator layer is over the edge region.

6. The method of claim 1, wherein the first insulator layer is over the transistor region.

7. The method of claim 1, further comprising forming a third semiconductor layer between the first and second semiconductor layers and having the first bandgap.

8. The method of claim 1, further comprising forming a buffer semiconductor layer between the substrate and the first semiconductor layer.

9. The method of claim 1, further comprising forming a conductor coupled to the edge region of the second semiconductor layer and to the substrate.

10. The method of claim 1, further comprising:
    forming an opening in the second semiconductor layer between the first insulator layer and the edge region; and
    forming a conductor in the opening and coupled to the edge region, the first semiconductor layer, and the substrate.

11. The method of claim 1, wherein the transistor and edge regions have a first conductivity; and further comprising forming a region of the first semiconductor layer below the transistor and edge regions and having a second conductivity.

12. The method of claim 1, wherein the transistor region has a first conductivity; and further comprising forming a region in the first semiconductor layer below the transistor region and the first insulator layer and having the first conductivity.

13. The method of claim 1, wherein the transistor region has a first conductivity; wherein the first semiconductor layer includes a region having a second conductivity; and further comprising forming a region in the region of the first semiconductor layer, below the first insulator layer, and remote from the transistor region, the region having the first conductivity.

14. The method of claim 1 wherein the transistor region comprises:
    a first portion having a first conductivity; and
    a second portion having a second conductivity.

15. A method for making a semiconductor structure comprising:
    forming a first semiconductor layer having a first bandgap;
    forming a second semiconductor layer over the first semiconductor layer and having a second bandgap less than the first bandgap;
    forming a transistor region having a plurality of source regions, and a gate region in the second semiconductor layer, and a drain region vertically spaced apart from the second semiconductor layer;
    forming a drain contact adjacent the drain region; and
    forming an edge region comprising
        a first insulator layer over the first semiconductor layer between and coplanar with the transistor region,
        a second insulator layer over the first insulator layer, and
        a conductive ring layer around the transistor region and extending over the second semiconductor layer and the second insulator layer and being electrically coupled to the drain contact.

16. The method of claim 15, wherein forming the first semiconductor layer comprises forming a first epitaxial layer; and wherein forming the second semiconductor layer comprises forming a second epitaxial layer.

17. The method of claim 15, further comprising forming an opening in the second semiconductor layer between the transistor and edge regions; and wherein the first insulator layer is in the opening.

18. The method of claim 15, wherein the first insulator layer is over the edge region.

19. The method of claim 15, wherein the first insulator layer is over the transistor region.

20. The method of claim 15, further comprising forming a third semiconductor layer between the first and second semiconductor layers and having the first bandgap.

21. The method of claim 15, wherein the transistor and edge regions have a first conductivity; and further comprising forming a region of the first semiconductor layer below the transistor and edge regions and having a second conductivity.

22. The method of claim 15, wherein the transistor region has a first conductivity; and further comprising forming a region in the first semiconductor layer below the transistor region and the first insulator layer and having the first conductivity.

23. A method for making a semiconductor structure comprising:
    forming a silicon layer over a silicon carbide layer;
    forming a transistor region having a plurality of source regions, and a gate region in the silicon layer, and a drain region vertically spaced apart from the silicon layer;
    forming a drain contact adjacent the drain region; and
    forming an edge region comprising
        a first insulator layer over the silicon carbide layer between and coplanar with the transistor region,
        a second insulator layer over the first insulator layer, and
        a conductive ring layer around the transistor region and extending over the silicon layer and the second insulator layer and being electrically coupled to the drain contact.

24. The method of claim 23, wherein forming the silicon carbide layer comprises forming a silicon carbide epitaxial layer; and wherein forming the silicon layer comprises forming a silicon epitaxial layer.

25. The method of claim 23, further comprising forming an opening in the silicon layer between the transistor and edge regions; and wherein the first insulator layer is in the opening.

26. The method of claim 23, wherein the first insulator layer is over the edge region.

27. The method of claim 23, wherein the first insulator layer is over the transistor region.

28. The method of claim 23, further comprising forming a third semiconductor layer between the silicon carbide layer and silicon layer.

29. The method of claim 23, wherein the transistor and edge regions have a first conductivity; and further comprising forming a region of the silicon carbide layer below the transistor and edge regions and having a second conductivity.

30. The method of claim 23, wherein the transistor region has a first conductivity; and further comprising forming a region in the silicon carbide layer below the transistor region and the first insulator layer and having the first conductivity.

* * * * *